United States Patent
Li et al.

(10) Patent No.: US 7,869,781 B2
(45) Date of Patent: Jan. 11, 2011

(54) METHOD AND SYSTEM FOR MITIGATING THE EFFECTS OF PULLING IN MULTIPLE PHASE LOCKED LOOPS IN MULTI-STANDARD SYSTEMS

(75) Inventors: Qiang Li, Irvine, CA (US); Razieh Roufoogaran, Venice, CA (US); Arya Behzad, Poway, CA (US); Dandan Li, San Diego, CA (US); Hung-Ming Chien, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 986 days.

(21) Appl. No.: 11/618,716

(22) Filed: Dec. 29, 2006

(65) Prior Publication Data

US 2008/0139150 A1 Jun. 12, 2008

Related U.S. Application Data

(60) Provisional application No. 60/868,818, filed on Dec. 6, 2006.

(51) Int. Cl.
*H04B 1/06* (2006.01)

(52) U.S. Cl. .................. 455/230; 455/552.1; 455/285; 455/553.1; 455/207; 455/209

(58) Field of Classification Search ............... 455/230, 455/552.1, 285, 553.1, 207, 209, 313
See application file for complete search history.

(56) References Cited

U.S. PATENT DOCUMENTS

| | | | |
|---|---|---|---|
| 6,766,178 B1 * | 7/2004 | Damgaard et al. | 455/552.1 |
| 6,960,962 B2 * | 11/2005 | Peterzell et al. | 331/40 |
| 7,398,071 B2 * | 7/2008 | Jensen | 455/260 |
| 7,403,750 B2 * | 7/2008 | Rosnell et al. | 455/127.4 |
| 7,421,250 B2 * | 9/2008 | Shi | 455/73 |
| 7,561,881 B2 * | 7/2009 | Feher | 455/440 |
| 2002/0173337 A1 * | 11/2002 | Hajimiri et al. | 455/552 |

* cited by examiner

*Primary Examiner*—Sanh D Phu
(74) *Attorney, Agent, or Firm*—McAndrews, Held & Malloy, Ltd.

(57) ABSTRACT

Certain aspects of a method and system for mitigating effects of pulling in multiple phase locked loops in multi-standard systems may include selecting an input frequency range of operation at a voltage controlled oscillator based on a particular wireless band of operation in a system that handles a first wireless communication protocol and a second wireless communication protocol. An image rejection mixer may be enabled to generate an output signal for the particular wireless band of operation based on mixing a plurality of received signals within a selected frequency range. An in-phase (I) component and a quadrature (Q) component of the generated output signal may be generated by utilizing a RC-CR quadrature network.

44 Claims, 7 Drawing Sheets

METHOD AND SYSTEM FOR MITIGATING THE EFFECTS OF PULLING IN MULTIPLE PHASE LOCKED LOOPS IN MULTI-STANDARD SYSTEMS

CROSS-REFERENCE TO RELATED APPLICATIONS/INCORPORATION BY REFERENCE

This patent application makes reference to, claims priority to and claims benefit from U.S. Provisional Patent Application Ser. No. 60/868,818, filed on Dec. 6, 2006.

This application makes reference to:

U.S. application Ser. No. 11/618,721 filed on Dec. 29, 2006;

U.S. application Ser. No. 11/618,719 filed on Dec. 29, 2006;

U.S. application Ser. No. 11/618,863 filed on Dec. 31, 2006; and

U.S. application Ser. No. 11/618,720 filed on Dec. 29, 2006.

Each of the above stated applications is hereby incorporated by reference in its entirety.

FIELD OF THE INVENTION

Certain embodiments of the invention relate to multi-standard systems. More specifically, certain embodiments of the invention relate to a method and system for mitigating effects of pulling in multiple phase locked loops in multi-standard systems.

BACKGROUND OF THE INVENTION

Both Bluetooth and WLAN radio devices, such as those used in, for example, handheld wireless terminals, generally operate in the 2.4 GHz (2.4000-2.4835 GHz) Industrial, Scientific, and Medical (ISM) unlicensed band. Other radio devices, such as those used in cordless phones, may also operate in the ISM unlicensed band. While the ISM band provides a suitable low-cost solution for many of short-range wireless applications, it may also have some drawbacks when multiple users operate simultaneously. For example, because of the limited bandwidth, spectrum sharing may be necessary to accommodate multiple users and/or multiple different types of communication protocols. Multiple active users may also result in significant interference between operating devices. Moreover, in some instances, other devices such as microwave ovens may also operate in this frequency spectrum and may produce significant interference or blocking signals that may affect Bluetooth and/or WLAN transmissions.

When operating a Bluetooth radio and a WLAN radio in, for example, a wireless device, at least two different types of interference effects may occur. First, when an interfering signal is present in a transmission medium along with the signal-of-interest, a low signal-to-noise-plus-interference ratio (SINR) may result. In this instance, for example, a Bluetooth signal may interfere with a WLAN signal or a WLAN signal may interfere with a Bluetooth signal. The second effect may occur when the Bluetooth and WLAN radio devices are collocated, that is, when they are located in close proximity to each other so that there is a small radio frequency (RF) path loss between their corresponding radio front-end receivers. In this instance, the isolation between the Bluetooth radio front-end and the WLAN radio front-end may be as low as 10 dB, for example. As a result, one radio may desensitize the front-end of the other radio upon transmission. Moreover, since Bluetooth employs transmit power control, the collocated Bluetooth radio may step up its power level when the signal-to-noise ratio (SNR) on the Bluetooth link is low, effectively compromising the front-end isolation between radio devices even further. Low noise amplifiers (LNAs) in the radio front-ends may not be preceded by a channel selection filter and may be easily saturated by the signals in the ISM band, such as those from collocated transmissions. The saturation may result in a reduction in sensitivity or desensitization of the receiver portion of a radio front-end, which may reduce the radio front-end's ability to detect and demodulate the desired signal.

Different techniques have been developed to address the low isolation problem that occurs between collocated Bluetooth and WLAN radio devices in coexistent operation. These techniques may take advantage of either frequency and/or time orthogonality mechanisms to reduce interference between collocated radio devices. Moreover, these techniques may result from so-called collaborative or non-collaborative mechanisms in Bluetooth and WLAN radio devices, where collaboration refers to any direct communication between the protocols. For example, Bluetooth technology utilizes Adaptive Frequency Hopping (AFH) as a frequency division multiplexing (FDM) technique that minimizes channel interference. In AFH, the physical channel is characterized by a pseudo-random hopping, at a rate of 1600 hops-per-second, between 79.1 MHz channels in the Bluetooth piconet. AFH provides a non-collaborative mechanism that may be utilized by a Bluetooth device to avoid frequencies occupied by a spread spectrum system such as a WLAN system. In some instances, the Bluetooth radio may be enabled to modify its hopping pattern based on, for example, frequencies in the ISM spectrum that are not being occupied by other users.

Even when frequency division multiplexing techniques are applied, significant interference may still occur because a strong signal in a separate channel may still act as a blocking signal and may desensitize the radio front-end receiver, that is, increase the receiver's noise floor to the point that the received signal may not be clearly detected. For example, a collocated WLAN radio front-end transmitter generating a 15 dBm signal acts as a strong interferer or blocker to a collocated Bluetooth radio device receiver when the isolation between radio devices is only 10 dB. Similarly, when a Bluetooth radio device is transmitting and a WLAN radio device is receiving, particularly when the Bluetooth radio front-end transmitter is operating as a 20 dBm Class 1 type, the WLAN radio device receiver may be desensitized by the Bluetooth transmission as the isolation between radios is reduced.

Oscillators may be utilized in wireless receivers and transmitters to provide frequency conversion, and to provide sinusoidal sources for modulation. The oscillators may operate over frequencies ranging from several kilohertz to many gigahertz, and may be tunable over a set frequency range. A typical oscillator may utilize a transistor with a LC network to control the frequency of oscillation. The frequency of oscillation may be tuned by adjusting the values of the LC resonator. A crystal controlled oscillator (XCO) may be enabled to provide an accurate output frequency, if the crystal is in a temperature controlled environment. A phase locked loop (PLL) may utilize a feedback control circuit and an accurate reference source such as a crystal controlled oscillator to provide an output that may be tunable with a high accuracy. Phase locked loops and other circuits that provide accurate and tunable frequency outputs may be referred to as frequency synthesizers.

Phase noise is a measure of the sharpness of the frequency domain spectrum of an oscillator, and may be critical for many modern wireless systems as it may severely degrade the performance of a wireless system. The phase noise may add to the noise level of the receiver, and a noisy local oscillator may lead to down conversion of undesired nearby signals. This may limit the selectivity of the receiver and the proximity of spacing adjacent channels in a wireless communication system.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for mitigating effects of pulling in multiple phase locked loops in multi-standard systems, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for mitigating effects of pulling in multiple phase locked loops in multi-standard systems. Aspects of the method and system may comprise selecting an input frequency range of operation at a voltage controlled oscillator based on a particular wireless band of operation in a system that handles a first wireless communication protocol and a second wireless communication protocol. An image rejection mixer may be enabled to generate an output signal for the particular wireless band of operation based on mixing a plurality of received signals within a selected frequency range. An in-phase (I) component and a quadrature (Q) component of the generated output signal may be generated by utilizing a RC-CR quadrature network.

Figure 1A:
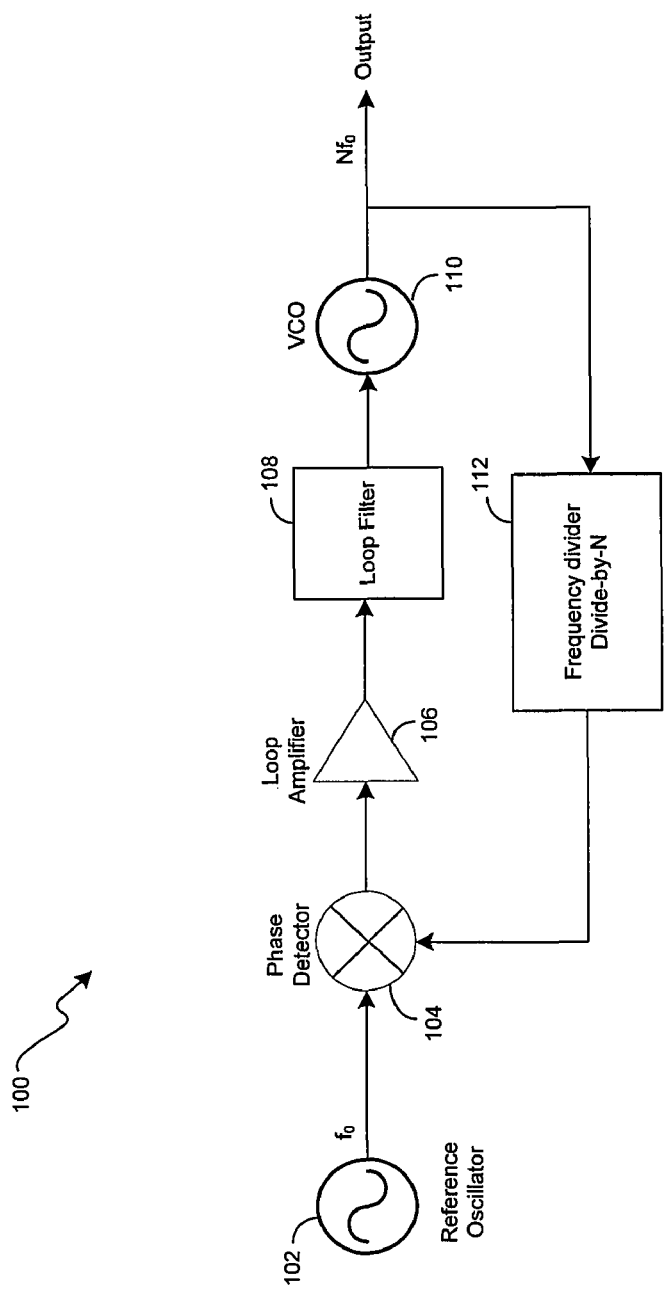
FIG. 1A is a block diagram of an exemplary phase locked loop that may be utilized in connection with an embodiment of the invention.

FIG. 1A is a block diagram of an exemplary phase locked loop that may be utilized in connection with an embodiment of the invention. Referring to FIG. 1A, there is shown a phase locked loop (PLL) 100 that comprises a reference oscillator 102, a phase detector 104, a loop amplifier 106, a loop filter 108, a voltage controlled oscillator (VCO) 110, and a frequency divider 112.

The reference oscillator 102 may comprise suitable logic, circuitry, and/or code that may be enabled to generate a constant frequency $f_0$. The reference oscillator may be, for example, a crystal controlled oscillator (XCO) that may be enabled to provide an accurate output frequency. The phase detector 104 may comprise suitable logic, circuitry, and/or code that may be enabled to generate a voltage proportional to the difference in phase of the signal generated by the reference oscillator 102 and the signal generated by the frequency divider 112, and may enable modifying the frequency of the VCO 110 in order to align the phase of the VCO 110 with that of the reference oscillator 102. The loop amplifier 106 may comprise suitable logic, circuitry, and/or code that may be enabled to amplify a received signal from the phase detector 104 and generate an amplified output signal to the loop filter 108. The loop filter 108 may comprise suitable logic, circuitry, and/or code that may be enabled to filter a received signal from the loop amplifier 106 and generate a filtered output signal to the VCO 110.

The frequency divider 112 may comprise suitable logic, circuitry, and/or code that may be enabled to divide the output of the VCO 110 by N, for example, to match the frequency of the reference oscillator 102. The frequency divider circuit 112 may be programmable to synthesize a plurality of closely spaced frequencies, which enables it to be utilized in commercial wireless applications with multiple channels. The VCO 110 may comprise suitable logic, circuitry, and/or code that may be enabled to generate an output frequency that may be N times the frequency of the reference oscillator, $Nf_0$, for example. The PLL 100 utilizes a feedback control circuit to allow the VCO 110 to track the phase of the stable reference oscillator 102. The PLL 100 may be utilized as frequency modulation (FM) demodulators, or carrier recovery circuits, or as frequency synthesizers for modulation and demodulation. The output of the PLL 100 may have a phase noise characteristic similar to that of the reference oscillator 102, but may operate at a higher frequency. The capture range of the PLL 100 may be defined as the range of input frequency for which the loop can acquire locking. The lock range of the PLL 100 may be defined as the input frequency range over which the loop may remain locked and may be larger than the capture range. The settling time of the PLL 100 may be defined as the time required for the loop to lock on to a new frequency.

Figure 1B:
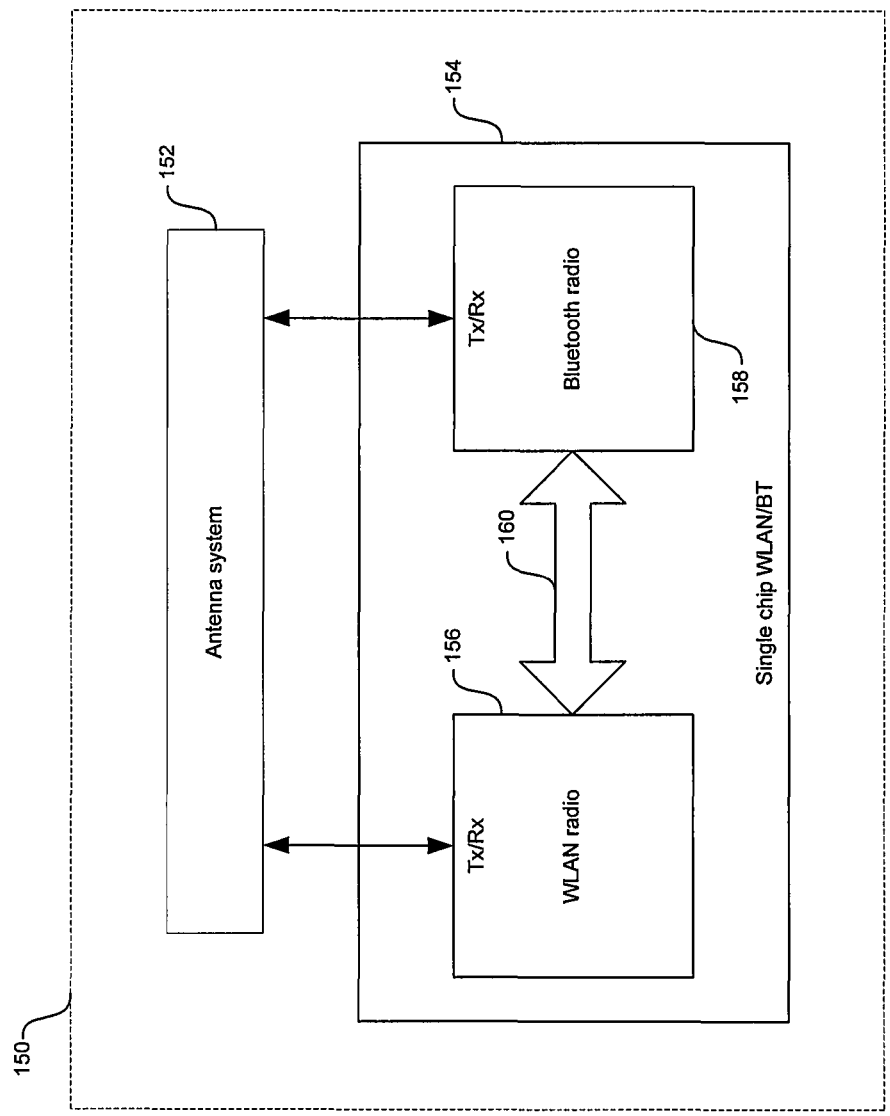
FIG. 1B is a block diagram that illustrates an exemplary single radio chip that supports WLAN and Bluetooth radio operations, in accordance with an embodiment of the invention.

FIG. 1B is a block diagram that illustrates an exemplary single radio chip that supports WLAN and Bluetooth radio operations, in accordance with an embodiment of the invention. Referring to FIG. 1B, there is shown a mobile phone 150 that may comprise a WLAN/Bluetooth coexistence antenna system 152 and a single chip WLAN/Bluetooth (WLAN/BT) radio device 154. The single chip WLAN/BT radio device 154 may comprise a WLAN radio portion 156 and a Bluetooth radio portion 158. The single chip WLAN/BT radio device 154 may be implemented based on a system-on-chip (SOC) architecture, for example.

The WLAN/Bluetooth coexistence antenna system 152 may comprise suitable hardware, logic, and/or circuitry that may be enabled to provide WLAN and Bluetooth communication between external devices and a coexistence terminal. The WLAN/Bluetooth coexistence antenna system 152 may comprise at least one antenna for the transmission and reception of WLAN and Bluetooth packet traffic.

The WLAN radio portion 156 may comprise suitable logic, circuitry, and/or code that may be enabled to process WLAN protocol packets for communication. The WLAN radio portion 156 may be enabled to transfer and/or receive WLAN protocol packets and/or information to the WLAN/Bluetooth coexistence antenna system 152 via a single transmit/receive (Tx/Rx) port. In some instances, the transmit port (Tx) may be implemented separately from the receive port (Rx). The WLAN radio portion 156 may also be enabled to generate signals that control at least a portion of the operation of the WLAN/Bluetooth coexistence antenna system 152. Firmware operating in the WLAN radio portion 156 may be utilized to schedule and/or control WLAN packet communication, for example.

The WLAN radio portion 156 may also be enabled to receive and/or transmit priority signals 160. The priority signals 160 may be utilized to schedule and/or control the collaborative operation of the WLAN radio portion 156 and the Bluetooth radio portion 158. In this regard, the priority signals 160 may comprise a plurality of signals to implement various levels of transmission priority. For example, a single signal implementation may result in two transmission priority levels, a two-signal implementation may result in up to four different transmission priority levels, and a three-signal implementation may result in up to eight different transmission priority levels.

The Bluetooth radio portion 158 may comprise suitable logic, circuitry, and/or code that may be enabled to process Bluetooth protocol packets for communication. The Bluetooth radio portion 158 may be enabled to transfer and/or receive Bluetooth protocol packets and/or information to the WLAN/Bluetooth coexistence antenna system 152 via a single transmit/receive (Tx/Rx) port. In some instances, the transmit port (Tx) may be implemented separately from the receive port (Rx). The Bluetooth radio portion 158 may also be enabled to generate signals that control at least a portion of the operation of the WLAN/Bluetooth coexistence antenna system 152. Firmware operating in the Bluetooth radio portion 158 may be utilized to schedule and/or control Bluetooth packet communication. The Bluetooth radio portion 158 may also be enabled to receive and/or transmit priority signals 160. A portion of the operations supported by the WLAN radio portion 156 and a portion of the operations supported by the Bluetooth radio portion 158 may be performed by common logic, circuitry, and/or code.

In some instances, at least a portion of either the WLAN radio portion 156 or the Bluetooth radio portion 158 may be disabled and the wireless terminal may operate in a single-communication mode, that is, coexistence may be disabled. When at least a portion of the WLAN radio portion 156 is disabled, the WLAN/Bluetooth coexistence antenna system 152 may utilize a default configuration to support Bluetooth communication. When at least a portion of the Bluetooth radio portion 158 is disabled, the WLAN/Bluetooth coexistence antenna system 152 may utilize a default configuration to support WLAN communication.

Figure 2A:
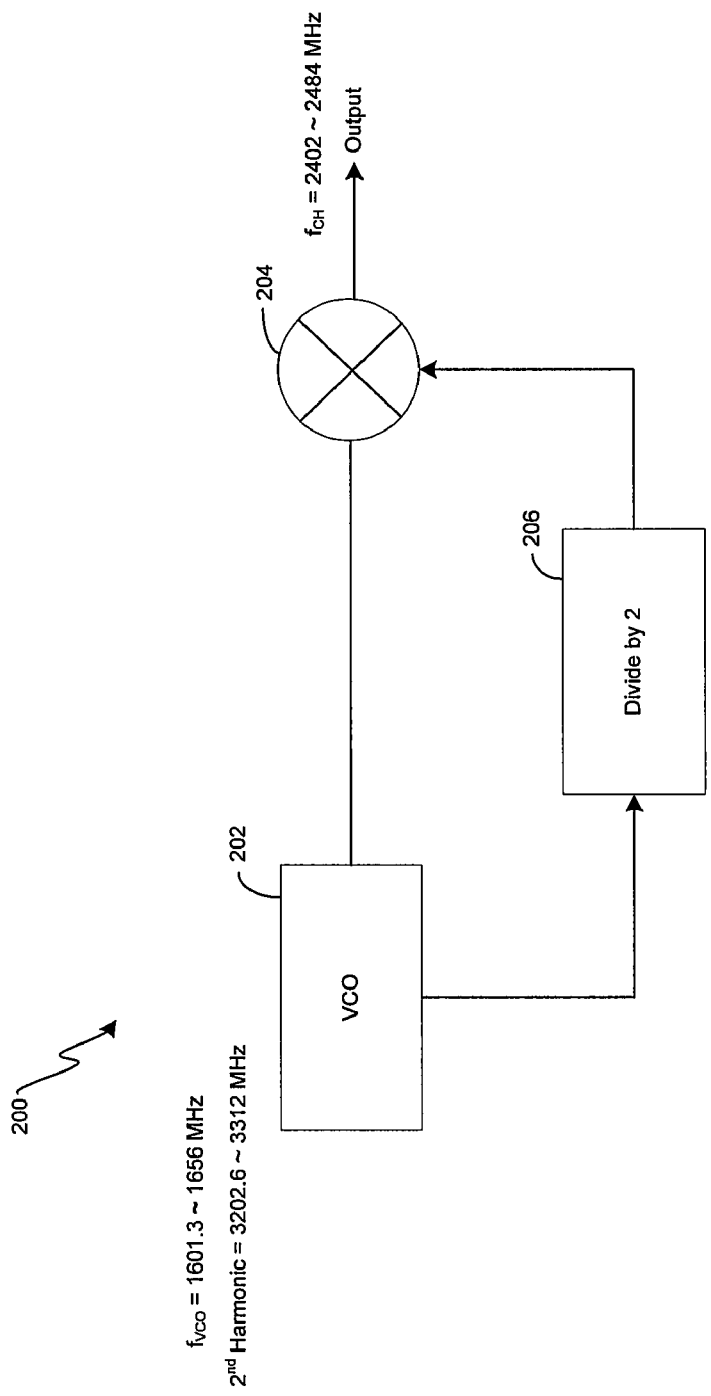
FIG. 2A is a block diagram of an exemplary local oscillator generator for Bluetooth wireless communication systems that may be utilized in connection with an embodiment of the invention.

FIG. 2A is a block diagram of an exemplary local oscillator generator for Bluetooth wireless communication systems that may be utilized in connection with an embodiment of the invention. Referring to FIG. 2A, there is shown a Bluetooth local oscillator (LO) generator 200 that comprises a VCO 202, a mixer 204, and a divide by 2 circuit 206.

The VCO 202 may comprise suitable logic, circuitry, and/or code that may be enabled to generate an output frequency that may be a multiple of the frequency of a reference oscillator. The VCO 202 may be enabled to operate in a frequency range of about 1601.3 MHz to 1656 MHz, for example, for Bluetooth operation. The second harmonic of the signals generated by the VCO 202 may be in a frequency range of about 3202.6 MHz to 3312 MHz, for example.

The divide by 2 circuit 206 may comprise suitable logic, circuitry, and/or code that may be enabled to generate the in-phase (I) and quadrature (Q) components of a received signal, and may output the generated I and Q components to the mixer 204. The divide by 2 circuit 202 may be enabled to divide the frequency of the received input signal and generate an output signal with half the frequency of the received input signal. The mixer 204 may comprise suitable logic, circuitry, and/or code that may be enabled to mix the frequencies of the received signals from the VCO 202 and the divide by 2 circuit 206 and generate an output signal to the transmitter or receiver. The output signal may be in a frequency range of about 2402 MHz to 2484 MHz, for example, for Bluetooth operation.

Figure 2B:
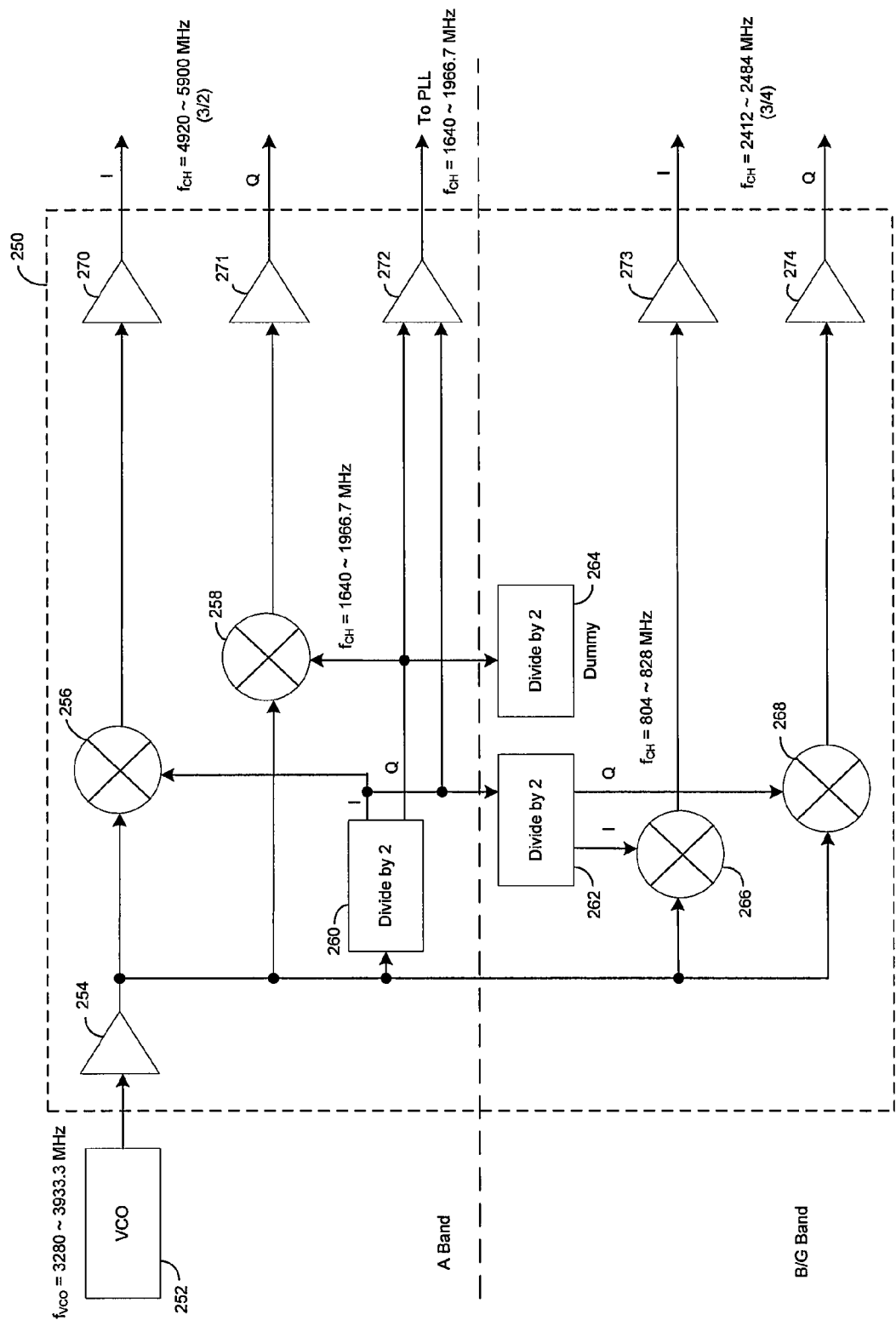
FIG. 2B is a block diagram of an exemplary local oscillator generator for wireless LAN communication systems, in accordance with an embodiment of the invention.

FIG. 2B is a block diagram of an exemplary local oscillator generator for wireless LAN communication systems, in accordance with an embodiment of the invention. Referring to FIG. 2B, there is shown a VCO 252, and a local oscillator (LO) generator 250 for wireless LAN (WLAN) operation. The LO generator 250 may comprise a VCO buffer 254, a plurality of mixers 256, 258, 266, and 268, a plurality of divide by 2 circuits 260, 262, and 264, and a plurality of buffers 270, 271, 272, 273, and 274.

The VCO 252 may comprise suitable logic, circuitry, and/or code that may be enabled to generate an output frequency that may be a multiple of the frequency of a reference oscillator. The VCO 252 may be enabled to operate in a frequency range of about 3280 MHz to 3933.3 MHz, for example, for wireless LAN operation. The VCO buffer 254 may comprise suitable logic, circuitry, and/or code that may be enabled to buffer and/or store the received signals from the VCO 254.

The plurality of divide by 2 circuits 260, 262, and 264 may comprise suitable logic, circuitry, and/or code that may be enabled to generate the in-phase (I) and quadrature (Q) components of a received signal, and may output the generated I and Q components to a plurality of mixers. The divide by 2 circuit 260 may be enabled to divide the frequency of the received input signal from the VCO 252 and generate an output signal with half the frequency of the received input signal. For example, the divide by 2 circuit 260 may generate I and Q components of an output signal in the frequency range of about 1640 MHz to 1966.7 MHz, for example. The divide by 2 circuit 262 may be enabled to divide the frequency of the received I component of the output signal from the divide by 2 circuit 260 and generate an output signal with half the frequency of the received input signal. For example, the divide by 2 circuit 262 may generate I and Q components of an output signal in the frequency range of about 804 MHz to 828 MHz, for example. The divide by 2 circuit 264 may be a dummy circuit and may be enabled to receive the Q component of the output signal from the divide by 2 circuit 260. The Q component generated by the divide-by-two circuit 260 may be coupled to the dummy load or divide by 2 circuit 264 with negligible power consumption. This results in symmetric loading of the divide-by-two circuit 260 and perfect I-Q matching.

The plurality of mixers 256, 258, 266, and 268 may comprise suitable logic, circuitry, and/or code that may be enabled to mix the frequencies of the received signals from the VCO 252 and the corresponding divide by 2 circuits to generate a plurality of output signals to the plurality of buffers 270, 271, 273, and 274. For example, the mixer 256 may be enabled to mix the frequency of the received signal from the VCO 252 and the frequency of the I component of the received signal from the divide by 2 circuit 260 to generate an output signal to the buffer 270. The mixer 258 may be enabled to mix the frequency of the received signal from the VCO 252 and the frequency of the Q component of the received signal from the divide by 2 circuit 260 to generate an output signal to the buffer 271. The mixer 266 may be enabled to mix the frequency of the received signal from the VCO 252 and the frequency of the I component of the received signal from the divide by 2 circuit 266 to generate an output signal to the buffer 273. The mixer 268 may be enabled to mix the frequency of the received signal from the VCO 252 and the frequency of the Q component of the received signal from the divide by 2 circuit 266 to generate an output signal to the buffer 274. The buffer 272 may be enabled to receive the I and Q components of the output signal from the divide by circuit 260 and generate an output signal to a PLL. The output signal to the PLL may be in the frequency range of about 1640 MHz to 1966.7 MHz, for example.

The buffers 270 and 271 may be enabled to generate the I and Q components of the output signal to a transmitter/receiver for 802.11 a band WLAN operation. The I and Q components of the output signal may be in the frequency range of about 4920 MHz to 5900 MHz, for example, for 802.11 a band WLAN operation. The buffers 273 and 274 may be enabled to generate the I and Q components of the output signal to a transmitter/receiver for 802.11 b/g band WLAN operation. The I and Q components of the output signal may be in the frequency range of about 2412 MHz to 2484 MHz, for example, for 802.11 b/g band WLAN operation.

The VCO 252 operating in a frequency range of about 3280 MHz to 3933.3 MHz, for example, for wireless LAN operation. The range of second harmonics generated by the VCO 202 may be in a frequency range of about 3202.6 MHz to 3312 MHz, for example, for Bluetooth operation. In a chip handling both WLAN communication protocol and Bluetooth communication protocol, the VCO 252 may get pulled by the second harmonics generated by the VCO 202 because of the interference of the frequencies of the generated signals from the VCO 202 and the VCO 252. The divide by 2 circuit 260 may generate I and Q components of an output signal in the frequency range of about 1640 MHz to 1966.7 MHz, for example. Similarly, the VCO 202 may get pulled by the output of the divide by 2 circuit 260 because of the interference of the frequencies of the generated signals of the VCO 202 and the divide by 2 circuit 260.

Figure 3:
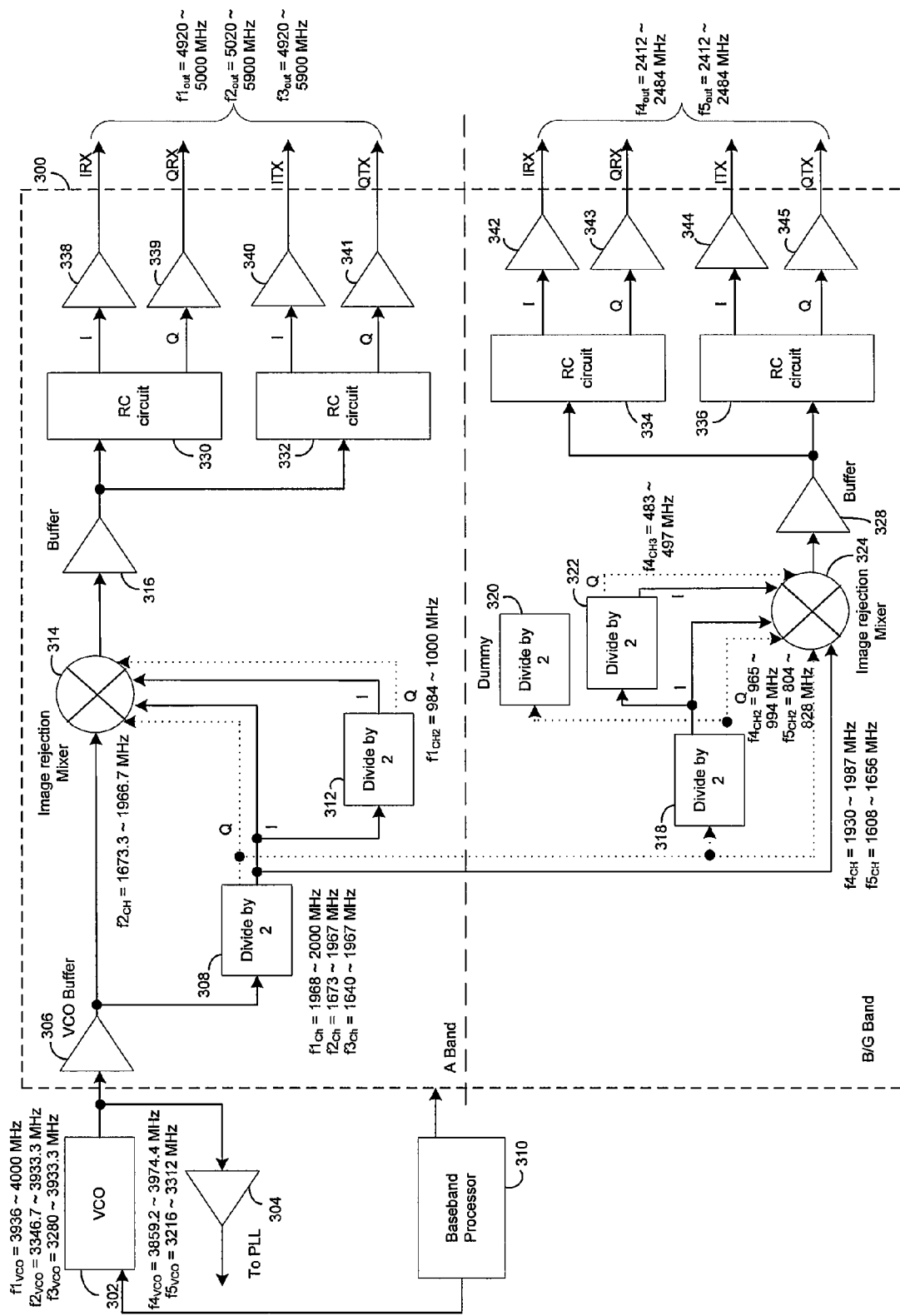
FIG. 3 is a block diagram of an exemplary local oscillator generator architecture for multi-standard wireless communication systems, in accordance with an embodiment of the invention.

FIG. 3 is a block diagram of an exemplary local oscillator generator architecture for multi-standard wireless communication systems, in accordance with an embodiment of the invention. Referring to FIG. 3, there is shown a VCO 302, a buffer 304, a processor 310, and a LO generator 300. The LO generator 300 may comprise a VCO buffer 306, a plurality of image rejection mixers 314 and 324, a plurality of divide by 2 circuits 308, 312, 318, 320, and 322, a plurality of buffers 316 and 328, a plurality of RC circuits 330, 332, 334, and 336, and a plurality of last stage buffers 338, 339, 340, 341, 342, 343, 344, and 345.

The VCO 302 may comprise suitable logic, circuitry, and/or code that may be enabled to generate an output frequency that may be a multiple of the frequency of a reference oscillator. The VCO 302 may be enabled to operate in a plurality of frequency ranges. For example, the VCO 302 may be enabled to operate in a first frequency range, $f1_{VCO}$ of about 3936 MHz to 4000 MHz in divide by 4 mode to generate an output frequency range $f1_{out}$ of about 4920 MHz to 5000 MHz, where $f1_{out}=f1_{VCO} \times 5/4$, for example, a second frequency range, $f2_{VCO}$ of about 3346.7 MHz to 3933.3 MHz in divide by 2 mode to generate an output frequency range $f2_{out}$ of about 5020 MHz to 5900 MHz, where $f2_{out}=f2_{VCO} \times 3/2$, for example, and a third frequency range, $f3_{VCO}$ of about 3280 MHz to 3933.3 MHz in divide by 2 mode to generate an output frequency range $f3_{out}$ of about 4920 MHz to 5900 MHz, where $f3_{out}=f3_{VCO} \times 3/2$, for example, for 802.11 a band WLAN operation. The VCO 302 may be enabled to operate in a fourth frequency range, $f4_{VCO}$ of about 3859.2 MHz to 3974.4 MHz in divide by 8 mode to generate an output frequency range $f4_{out}$ of about 2412 MHz to 2484 MHz, where $f4_{out}=f4_{VCO} \times 5/8$, for example, and a fifth frequency range, $f5_{VCO}$ of about 3216 MHz to 3312 MHz in divide by 4 mode to generate an output frequency range $f5_{out}$ of about 2412 MHz to 2484 MHz, where $f5_{out}=f5_{VCO} \times 3/4$, for example, for 802.11 b/g band WLAN operation. The buffer 304 may be enabled to receive a signal from the VCO 302 and generate an output to a PLL in the same frequency range as VCO 302.

The baseband processor 310 may comprise suitable logic, circuitry, and/or code that may be enabled to select LO generator 300 divider configurations depending on a required output frequency range and an input frequency range of operation at VCO 302 based on a particular wireless band of operation, for example, 802.11 a/b/g wireless band of operation. The VCO buffer 306 may comprise suitable logic, circuitry, and/or code that may be enabled to buffer and/or store the received signals from the VCO 302. The plurality of divide by 2 circuits 308, 312, 318, 320, and 322 may comprise suitable logic, circuitry, and/or code that may be enabled to generate the in-phase (I) and quadrature (Q) components of a received signal, and may output the generated I and Q components to a plurality of mixers.

The divide by 2 circuit 308 may be enabled to divide the frequency of the received input signal from the VCO 302 and generate an output signal with half the frequency of the received input signal. For example, the divide by 2 circuit 308 may generate I and Q components of an output signal in the frequency range, $f1_{CH}$ of about 1968 MHz to 2000 MHz, for example, for 802.11 a band WLAN operation in divide by 4 mode and VCO range of $f1_{VCO}$. The divide by 2 circuit 308 may generate I and Q components of an output signal in the frequency range, $f2_{CH}$ of about 1673 MHz to 1967 MHz, for example, for 802.11 a band WLAN operation in divide by 2 mode and VCO range of $f2_{VCO}$. The divide by 2 circuit 308 may generate I and Q components of an output signal in the frequency range, $f3_{CH}$ of about 1640 MHz to 1967 MHz, for example, for 802.11 a band WLAN operation in divide by 2 mode and VCO range of $f3_{VCO}$. The divide by 2 circuit 308 may generate I and Q components of an output signal in the frequency range, $f4_{CH}$ of about 1930 MHz to 1987 MHz, for example, for 802.11 b/g band WLAN operation in divide by 8 mode and VCO range of $f4_{VCO}$. The divide by 2 circuit 308 may generate I and Q components of an output signal in the frequency range, $f5_{CH}$ of about 1608 MHz to 1656 MHz, for example, for 802.11 b/g band WLAN operation in divide by 4 mode and VCO range of $f5_{VCO}$.

The divide by 2 circuit 312 may be enabled to divide the frequency of the received I component of the output signal from the divide by 2 circuit 308 and generate an output signal with half the frequency of the received input signal. For example, the divide by 2 circuit 312 may generate I and Q components of an output signal in the frequency range, $f1_{CH2}$ of about 984 MHz to 1000 MHz, for example, for 802.11 a band WLAN operation in divide by 4 mode and VCO range of $f1_{VCO}$.

The divide by 2 circuit 318 may be enabled to divide the frequency of the received Q component of the output signal from the divide by 2 circuit 308 and generate an output signal with half the frequency of the received input signal for 802.11 b/g band WLAN operation. The divide by 2 circuit 318 may generate I and Q components of an output signal in the frequency range, $f4_{CH2}$ of about 965 MHz to 994 MHz, for example, in divide by 8 mode and VCO range of $f4_{VCO}$. The divide by 2 circuit 318 may generate I and Q components of an output signal in the frequency range, $f5_{CH2}$ of about 804 MHz to 828 MHz, for example, in divide by 4 mode and VCO range of $f5_{VCO}$. The divide by 2 circuit 322 may be enabled to divide the frequency of the received I component of the output signal from the divide by 2 circuit 318 and generate an output signal with half the frequency of the received input signal for 802.11 b/g band WLAN operation. For example, the divide by 2 circuit 322 may generate I and Q components of an output signal in the frequency range, $f4_{CH3}$ of about 482 MHz to 497 MHz, for example for 802.11 b/g band WLAN operation in divide by 8 mode and VCO range of $f4_{VCO}$.

The divide by 2 circuit 320 may be a dummy circuit and may be enabled to receive the Q component of the output signal from the divide by 2 circuit 318. The Q component generated by the divide-by-two circuit 318 may be coupled to the dummy load or divide by 2 circuit 320 with negligible power consumption. This results in symmetric loading of the divide-by-two circuit 318 and perfect I-Q matching. The dummy load may comprise a load that is equivalent to the divide by 2 circuit 322.

The divide by 2 circuit 308 may be symmetrically loaded. For example, the I component of the divide by 2 circuit 308 may be coupled to a divide by 2 circuit 312 and the plurality of image rejection mixers 314 and 324. Similarly, the Q component of the divide by 2 circuit 308 may be coupled to a divide by 2 circuit 318 and the plurality of image rejection mixers 314 and 324.

The image rejection mixer 314 may comprise suitable logic, circuitry, and/or code that may be enabled to mix the frequencies of the received signals from the VCO 302 and at least one of the plurality of divide by 2 circuits 308 and 312 to generate an output signal to the buffer 316. The image rejection mixer 314 may be enabled to suppress unwanted images of frequencies by processing the received signal and image differently. The image rejection mixer 31411, may be enabled to receive the I and Q components of the output signals generated by the plurality of divide by 2 circuits 308 and 312. The image rejection mixer 314 may be enabled to generate an output signal for the particular wireless band of operation based on mixing a plurality of received signals within a selected frequency range. The buffer 316 may be enabled to generate a buffered output of the received signal from the image rejection mixer 314 to the plurality of RC circuits 330 and 332. The baseband processor 310 may be enabled to select at least one of the plurality of signals received from the plurality of divide by 2 circuits 308 and 312. For example, the image rejection mixer 314 may be enabled to mix the frequency of the received signal from the VCO buffer 306, and one of the frequencies of the I and Q components of the received signal from the divide by 2 circuit 308, and the frequency of the I and Q components of the received signal from the divide by 2 circuit 312 to generate an output signal to the buffer 316.

The image rejection mixer 324 may comprise suitable logic, circuitry, and/or code that may be enabled to mix the frequencies of the received signals from the divide by 2 circuit 308 and at least one of the plurality of divide by 2 circuits 318 and 322 to generate an output signal to the buffer 328. The image rejection mixer 324 may be enabled to suppress unwanted images of frequencies by processing the received signal and image differently. The image rejection mixer 324 may be enabled to receive the I and Q components of the output signals generated by the plurality of divide by 2 circuits 308, 318, and 322. The image rejection mixer 324 may be enabled to generate an output signal for the particular wireless band of operation based on mixing a plurality of received signals within a selected frequency range. The buffer 328 may be enabled to generate a buffered output of the received signal from the image rejection mixer 324 to the plurality of RC circuits 334 and 336. The baseband processor 310 may be enabled to select at least one of the plurality of signals received from the plurality of divide by 2 circuits 318 and 322. For example, the image rejection mixer 324 may be enabled to mix the frequency of the I and Q components of the received signal from the divide by 2 circuit 308, and one of the frequencies of the I and Q components of the received signal from the divide by 2 circuit 318 and the frequency of the I and Q components of the received signal from the divide by 2 circuit 322 to generate an output signal to the buffer 328.

The plurality of RC circuits 330 and 332 may comprise suitable logic, circuitry, and/or code that may be enabled to generate I and Q components of a received signal to the plurality of last stage buffers 338, 339, 340, and 341 by shifting the phase of the received signal from the buffer 316. The plurality of last stage buffers 338, 339, 340, and 341 may be enabled to amplify signals and generate an output to a transmitter/receiver for 802.11 a band WLAN operation. The I and Q components of the output signal generated by the plurality of last stage buffers 338, 339, 340 and 341 may be in the frequency range, $f1_{out}$ of about 4920 MHz to 5000 MHz, for example, for 802.11 a band WLAN operation in divide by 4 mode and VCO range of $f1_{VCO}$. The I and Q components of the output signal generated by the plurality of last stage buffers 338, 339, 340 and 341 may be in the frequency range, $f2_{out}$ of about 5020 MHz to 5900 MHz, for example, for 802.11 a band WLAN operation in divide by 2 mode and VCO range of $f2_{VCO}$. The I and Q components of the output signal generated by the plurality of last stage buffers 338, 339, 340 and 341 may be in the frequency range, $f_{out}$ of about 4920 MHz to 5900 MHz, for example, for 802.11 a band WLAN operation in divide by 2 mode and VCO range of $f3_{VCO}$.

The plurality of RC circuits 334 and 336 may comprise suitable logic, circuitry, and/or code that may be enabled to generate I and Q components of a received signal to the plurality of last stage buffers 342, 343, 344, and 345 by shifting the phase of the received signal from the buffer 328. The plurality of last stage buffers 342, 343, 344, and 345 may be enabled to amplify signals and generate an output to a transmitter/receiver for 802.11 b/g band WLAN operation. The I and Q components of the output signal generated by the plurality of last stage buffers 342, 343, 344 and 345 may be in the frequency range, $f4_{out}$ of about 2412 MHz to 2484 MHz, for example, for 802.11 b/g band WLAN operation in divide by 8 mode and VCO range of $f4_{VCO}$. The I and Q components of the output signal generated by the plurality of last stage buffers 341, 343, 344, and 345 may be in the frequency range, $f5_{out}$ of about 2412 MHz to 2484 MHz, for example, for 802.11 b/g band WLAN operation in divide by 4 mode and VCO range of $f5_{VCO}$.

In a chip handling both WLAN connection and Bluetooth connection, the baseband processor 310 may avoid pulling of the VCO 302 by the second harmonics generated by the VCO 202 by selecting an input frequency range of operation at VCO 302 based on a particular wireless band of operation, for example, 802.11 a/b/g wireless band of operation. Similarly, the I and Q components of an output signal generated by the divide by 2 circuit 308 in the frequency range of about 1673.3 MHz to 1966.7 MHz, for example, may not interfere with frequencies of the generated signals of the VCO 202 operating in a Bluetooth mode of operation.

Figure 4A:
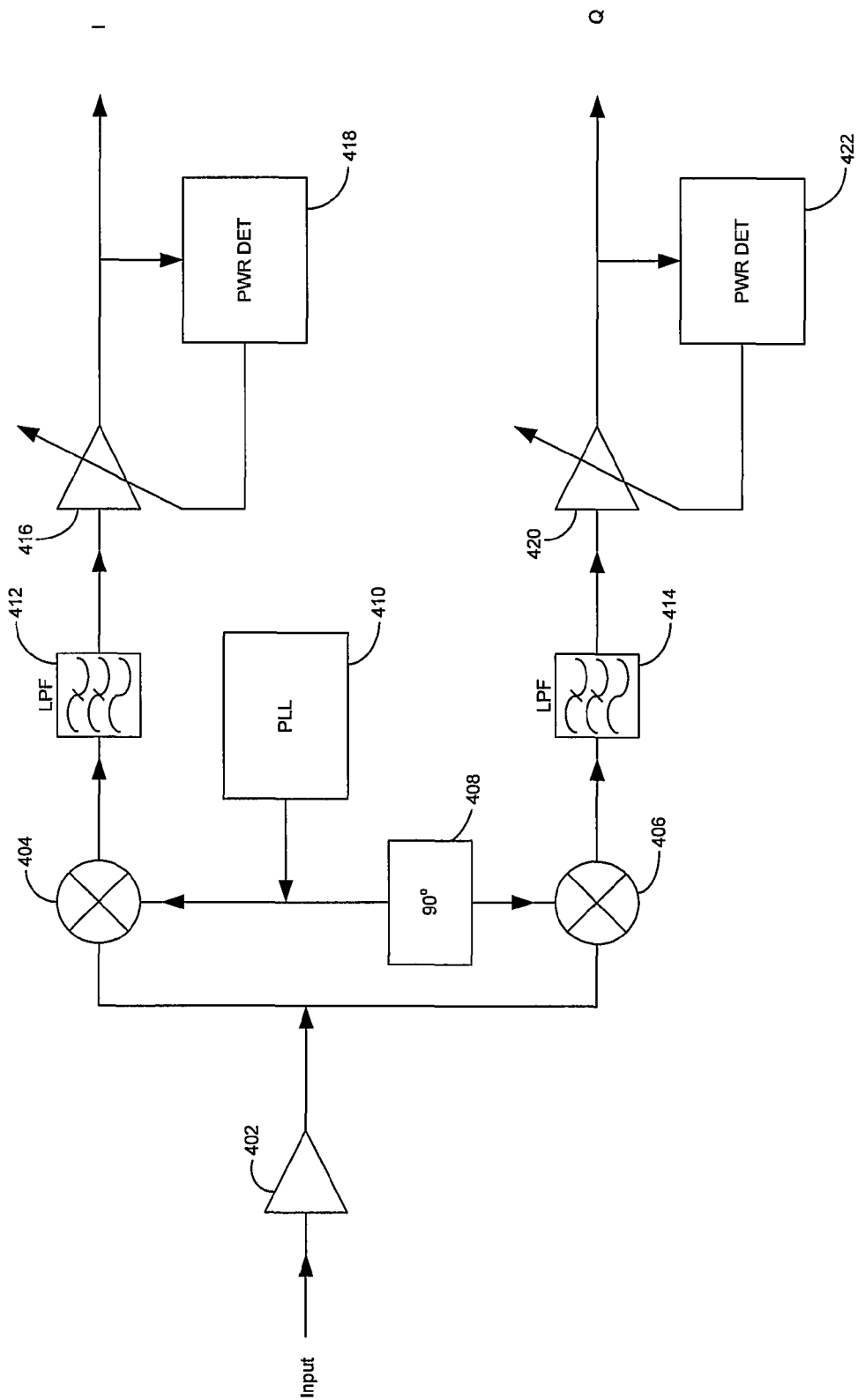
FIG. 4A is a block diagram of a direct-conversion receiver that may be utilized in connection with an embodiment of the invention.

FIG. 4A is a block diagram of a direct-conversion receiver that may be utilized in connection with an embodiment of the invention. Referring to FIG. 4A, there is shown an amplifier 402, a plurality of mixers 404 and 406, a plurality of low pass filters 412 and 414, a plurality of linear gain amplifiers 416 and 420, a plurality of power detectors 418 and 422, a phase splitter 408 and a phase locked loop (PLL) 410.

The amplifier 402 may be enabled to receive an input signal and may generate an amplified output signal to the plurality of mixers 404 and 406. The plurality of mixers 404 and 406 may be enabled to downconvert the analog RF substreams to baseband. The phase splitter 408 may be enabled to determine whether ensure the mixer local oscillator inputs are in quadrature, indicating that they are 90 degrees out of phase with respect to each other. Alternatively, one path may be shifted by positive (+) 45 degrees and the other path may be shifted by negative (−) 45 degrees, for example. The phase locked loop 410 may be enabled to drive the mixer local oscillator inputs and the phase splitter 408. The plurality of low pass filters 412 and 414 may be enabled to filter the received signals in order to allow a desired channel of frequencies. The plurality of linear gain amplifiers 416 and 420 may be enabled to maintain a constant amplitude of the received signals and may be controlled by the plurality of power detectors 418 and 422 and generate the I and Q components of the received signal.

Figure 4B:
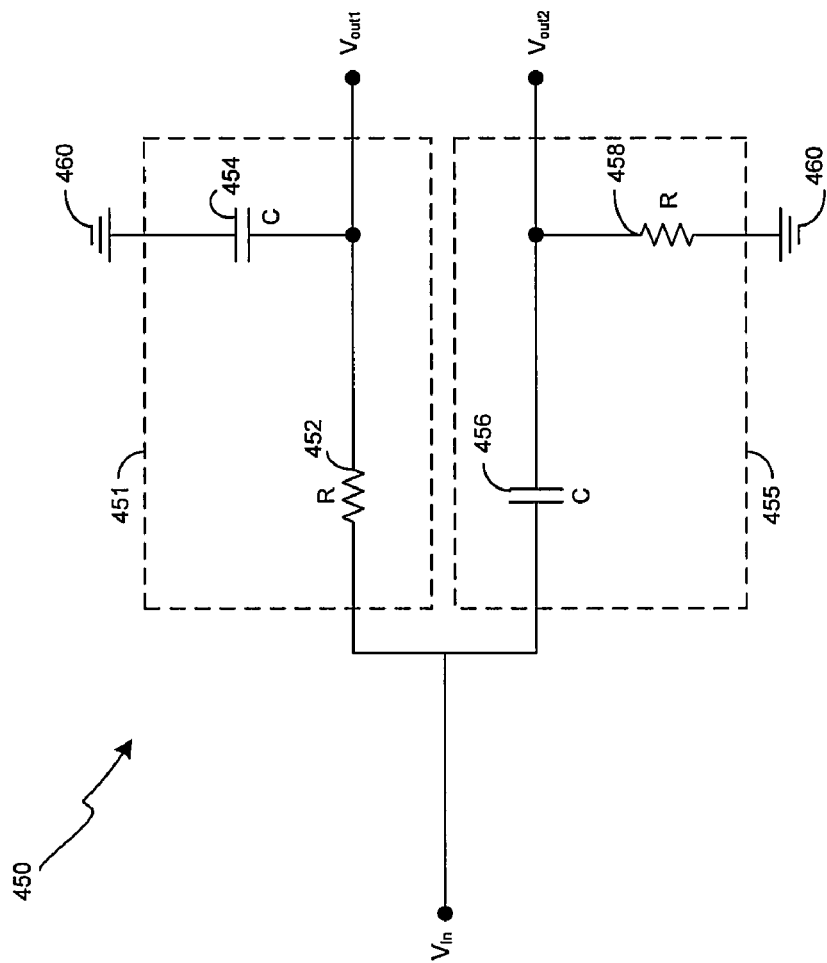
FIG. 4B is a block diagram of an exemplary RC-CR quadrature network that may be utilized in connection with an embodiment of the invention.

FIG. 4B is a block diagram of an exemplary RC-CR quadrature network that may be utilized in connection with an embodiment of the invention. Referring to FIG. 4B, there is shown a RC-CR quadrature network 450 that comprises a RC circuit 451 and a CR circuit 455 and a ground (GND) 460. The RC circuit 451 may comprise a resistor R 452 and a capacitor C 454. The CR circuit 455 may comprise a resistor R 458 and a capacitor C 456.

The input $V_{in}$ may be a sinusoidal input signal with frequency ω. The RC circuit 451 comprising R 452 and C 454 may be enabled to generate a phase shifted output $V_{out1}(t)$ equal to $\pi/2 - \tan^{-1}(RC\omega)$. The CR circuit 455 comprising R 458 and C 456 may be enabled to generate a phase shifted output $V_{out2}(t)$ equal to $-\tan^{-1}(RC\omega)$. $V_{out1}$ and $V_{out2}$ have a 90 degree phase difference at all frequencies. The amplitude of the output signals, $V_{out1}$ and $V_{out2}$ may be equal at $\omega = 1/(RC)$. The RC-CR quadrature network 450 may be utilized to generate the I and Q components of the received signal $V_{in}$.

In accordance with an embodiment of the invention, a method and system for mitigating effects of pulling in multiple phase locked loops in multi-standard systems may include selection of an input frequency range of operation at a voltage controlled oscillator (VCO) 302 based on a particular wireless band of operation, for example, 802.11 a/b/g wireless band of operation. The image rejection mixer 314 or 324 may be enabled to generate an output signal for the particular wireless band of operation, for example, 802.11 a/b/g wireless band of operation based on mixing a plurality of received signals within a selected frequency range. An in-phase (I) component and a quadrature (Q) component of the generated output signal may be generated by utilizing the RC-CR quadrature network 330 and 332 for 802.11 a wireless band of operation. Similarly, an I component and a Q component of the generated output signal may be generated by utilizing the RC-CR quadrature network 334 and 336 for 802.11 b/g wireless band of operation.

The VCO buffer 306 may be enabled to buffer an output signal of the VCO 302. A first divider circuit, for example, divide by 2 circuit 308 may be coupled to the buffered output signal of VCO 302. A first generated I component signal and a first generated Q component signal from the first divider circuit, for example, divide by 2 circuit 308 may be communicated to the image rejection mixer 314. A second divider circuit, for example, divide by 2 circuit 312 may be coupled to the first generated I component signal from the first divider circuit, for example, divide by 2 circuit 308. A second generated I component signal and a second generated Q component signal from the second divider circuit, for example, divide by 2 circuit 312 may be communicated to the image rejection mixer 314. The image rejection mixer 314 may be enabled to mix the buffered output signal of VCO 302 with at least one of the following: the first generated I component signal and the second generated I component signal to generate the output signal for 802.11 a wireless band of operation. The generated output signal for 802.11 a wireless band of operation may be communicated to the RC-CR quadrature network comprising RC circuits 330 and 332 to generate the corresponding I and Q components of the output signal.

A third divider circuit, for example, divide by 2 circuit 318 may be coupled to the first generated Q component signal from the first divider circuit, for example, divide by 2 circuit 312. A third generated I component signal and a third generated Q component signal from the third divider circuit, for example, divide by 2 circuit 318 may be communicated to the image rejection mixer 324. A fourth divider circuit, for example, divide by 2 circuit 322 may be coupled to the third generated I component signal from the third divider circuit, for example, divide by 2 circuit 318. A dummy load, for example, divide by 2 circuit 320 may be coupled to a Q component output signal of the third divider circuit, for example, divide by 2 circuit 318 and the dummy load may comprise a load that is equivalent to the fourth divider circuit, for example, divide by 2 circuit 322. A fourth generated I component signal and a fourth generated Q component signal from the fourth divider circuit, for example, divide by 2 circuit 322 may be communicated to the image rejection mixer 324. The image rejection mixer 324 may be enabled to mix the first generated I component signal with at least one of the following: the third generated I component signal and the fourth generated I component signal to generate the output signal for at least one of the following: 802.11 b and 802.11 g wireless band of operation. The generated output signal for at least one of the following: 802.11 b and 802.11 g wireless band of operation may be communicated to the RC-CR quadrature network comprising RC circuits 334 and 336 to generate the corresponding I and Q components of the output signal.

The first wireless communication protocol may be a Bluetooth wireless communication protocol. The second wireless communication protocol may be a wireless LAN communication protocol. The first wireless communication protocol and the second wireless communication protocol may be handled by circuitry integrated on a single chip, for example, the single chip WLAN/BT radio device 154. In another embodiment of the invention, each of the first wireless communication protocol and the second wireless communication protocol may be handled by circuitry integrated on separate chips.

Another embodiment of the invention may provide a machine-readable storage, having stored thereon, a computer program having at least one code section executable by a machine, thereby causing the machine to perform the steps as described above for mitigating effects of pulling in multiple phase locked loops in multi-standard systems.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising:
   in a system that handles a first wireless communication protocol and a second wireless communication protocol, selecting an input frequency range of operation based on a particular wireless band of operation;
   generating an output signal for said particular wireless band of operation based on mixing a plurality of received signals within a selected frequency range; and
   generating an in-phase (I) component and a quadrature (Q) component of said generated output signal utilizing at least one quadrature network.

2. The method according to claim 1, comprising selecting said input frequency range of operation at a voltage controlled oscillator based on said particular wireless band of operation.

3. The method according to claim 2, comprising buffering an output signal of said voltage controlled oscillator.

4. The method according to claim 3, comprising coupling a first divider circuit to said buffered output signal of said voltage controlled oscillator.

5. The method according to claim 4, comprising communicating a first generated I component signal and a first generated Q component signal from said first divider circuit to at least one image rejection mixer.

6. The method according to claim 5, comprising coupling a second divider circuit to said first generated I component signal from said first divider circuit.

7. The method according to claim 6, comprising communicating a second generated I component signal and a second generated Q component signal from said second divider circuit to said at least one image rejection mixer.

8. The method according to claim 7, comprising mixing said buffered output signal of said voltage controlled oscillator with one of the following: said first generated I component signal and said second generated I component signal to generate said output signal for 802.11a wireless band of operation.

9. The method according to claim 8, comprising communicating said generated output signal for 802.11a wireless band of operation to said at least one quadrature network.

10. The method according to claim 5, comprising coupling a third divider circuit to said first generated Q component signal from said first divider circuit.

11. The method according to claim 10, comprising communicating a third generated I component signal and a third generated Q component signal from said third divider circuit to said at least one image rejection mixer.

12. The method according to claim 11, comprising coupling a fourth divider circuit to said third generated I component signal from said third divider circuit.

13. The method according to claim 12, comprising coupling a dummy load to a Q component output signal of said third divider circuit, wherein said dummy load comprises a load that is equivalent to said fourth divider circuit.

14. The method according to claim 13, comprising communicating a fourth generated I component signal and a fourth generated Q component signal from said fourth divider circuit to said at least one image rejection mixer.

15. The method according to claim 14, comprising mixing said first generated I component signal with at least one of the following: said third generated I component signal and said fourth generated I component signal to generate said output signal for one of the following: 802.11b and 802.11g wireless band of operation.

16. The method according to claim 15, comprising communicating said generated output signal for one of the following: 802.11b and 802.11g wireless band of operation to said at least one quadrature network.

17. The method according to claim 1, wherein said at least one quadrature network comprises a plurality of resistors and capacitors.

18. The method according to claim 1, wherein said first wireless communication protocol is a Bluetooth wireless communication protocol.

19. The method according to claim 1, wherein said second wireless communication protocol is a wireless LAN communication protocol.

20. The method according to claim 1, wherein said first wireless communication protocol and said second wireless communication protocol is handled by circuitry integrated on a single chip.

21. The method according to claim 1, wherein each of said first wireless communication protocol and said second wireless communication protocol is handled by circuitry integrated on separate chips.

22. A system for processing signals, the system comprising:
   one or more circuits for use within a system that handles a first wireless communication protocol and a second wireless communication protocol, said one or more circuits enables selection of an input frequency range of operation based on a particular wireless band of operation;

said one or more circuits enables generation of an output signal for said particular wireless band of operation based on mixing a plurality of received signals within a selected frequency range; and said one or more circuits enables generation of an in-phase (I) component and a quadrature (Q) component of said generated output signal utilizing at least one quadrature network.

23. The system according to claim 2, wherein said one or more circuits enables selection of said input frequency range of operation at a voltage controlled oscillator based on said particular wireless band of operation.

24. The system according to claim 23, wherein said one or more circuits enables buffering of an output signal of said voltage controlled oscillator.

25. The system according to claim 24, wherein said one or more circuits enables coupling of a first divider circuit to said buffered output signal of said voltage controlled oscillator.

26. The system according to claim 25, wherein said one or more circuits enables communication of a first generated I component signal and a first generated Q component signal from said first divider circuit to at least one image rejection mixer.

27. The system according to claim 26, wherein said one or more circuits enables coupling of a second divider circuit to said first generated I component signal from said first divider circuit.

28. The system according to claim 27, wherein said one or more circuits enables communication of a second generated I component signal and a second generated Q component signal from said second divider circuit to said at least one image rejection mixer.

29. The system according to claim 28, wherein said at least one image rejection mixer enables mixing of said buffered output signal of said voltage controlled oscillator with one of the following: said first generated I component signal and said second generated I component signal to generate said output signal for 802.11a wireless band of operation.

30. The system according to claim 29, wherein said one or more circuits enables communication of said generated output signal for 802.11a wireless band of operation to said at least one quadrature network.

31. The system according to claim 26, wherein said one or more circuits enables coupling of a third divider circuit to said first generated Q component signal from said first divider circuit.

32. The system according to claim 31, wherein said one or more circuits enables communication of a third generated I component signal and a third generated Q component signal from said third divider circuit to said at least one image rejection mixer.

33. The system according to claim 32, wherein said one or more circuits enables coupling of a fourth divider circuit to said third generated I component signal from said third divider circuit.

34. The system according to claim 33, wherein said one or more circuits enables coupling of a dummy load to a Q component output signal of said third divider circuit, wherein said dummy load comprises a load that is equivalent to said fourth divider circuit.

35. The system according to claim 34, wherein said one or more circuits enables communication of a fourth generated I component signal and a fourth generated Q component signal from said fourth divider circuit to said at least one image rejection mixer.

36. The system according to claim 35, wherein said at least one image rejection mixer enables mixing of said first generated I component signal with one of the following: said third generated I component signal and said fourth generated I component signal to generate said output signal for at least one of the following: 802.11b and 802.11g wireless band of operation.

37. The system according to claim 36, wherein said one or more circuits enables communication of said generated output signal for one of the following: 802.11b and 802.11g wireless band of operation to said at least one quadrature network.

38. The system according to claim 22, wherein said at least one quadrature network comprises a plurality of resistors and capacitors.

39. The system according to claim 22, wherein said first wireless communication protocol is a Bluetooth wireless communication protocol.

40. The system according to claim 22, wherein said second wireless communication protocol is a wireless LAN communication protocol.

41. The system according to claim 22, wherein said first wireless communication protocol and said second wireless communication protocol is handled by circuitry integrated on a single chip.

42. The system according to claim 22, wherein each of said first wireless communication protocol and said second wireless communication protocol is handled by circuitry integrated on separate chips.

43. The system according to claim 22, wherein said one or more circuits comprises an image rejection mixer.

44. The system according to claim 43, wherein said image rejection mixer enables mixing of said plurality of received signals within said selected frequency range based on said particular wireless band of operation.

* * * * *